US012581948B2

(12) United States Patent
Mun et al.

(10) Patent No.: US 12,581,948 B2
(45) Date of Patent: Mar. 17, 2026

(54) SEMICONDUCTOR PACKAGE

(71) Applicant: Samsung Electronics Co., Ltd.,
Suwon-si (KR)

(72) Inventors: Kyungdon Mun, Suwon-si (KR);
Eungkyu Kim, Suwon-si (KR);
Hyeonseok Lee, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 383 days.

(21) Appl. No.: 18/176,695

(22) Filed: Mar. 1, 2023

(65) Prior Publication Data

US 2024/0006262 A1     Jan. 4, 2024

(30) Foreign Application Priority Data

Jul. 1, 2022     (KR) ........................ 10-2022-0081507

(51) Int. Cl.
*H01L 23/367*          (2006.01)
*H01L 23/373*          (2006.01)
          (Continued)

(52) U.S. Cl.
CPC ...... *H01L 23/3677* (2013.01); *H01L 23/3738*
(2013.01); *H01L 23/49811* (2013.01); *H01L
23/49833* (2013.01); *H01L 23/49838*
(2013.01); *H01L 23/49866* (2013.01); *H01L
25/165* (2013.01); *H10B 80/00* (2023.02);
          (Continued)

(58) Field of Classification Search
None
See application file for complete search history.

(56) References Cited

U.S. PATENT DOCUMENTS 8,110,910 B2 *   2/2012   Kim ........................ H01L 24/97
                                                         438/109
8,310,045 B2    11/2012   Son
          (Continued)

FOREIGN PATENT DOCUMENTS

KR     10-2012-0123303 A     11/2012
KR     10-2020-0142966 A     12/2020

OTHER PUBLICATIONS

Office Action in Korean Appln. No. 10-2022-0081507, mailed on
Dec. 17, 2025, 19 pages (with English translation).

*Primary Examiner* — Long Pham
(74) *Attorney, Agent, or Firm* — Fish & Richardson P.C.

(57)          ABSTRACT

A semiconductor package includes a first redistribution
structure, a first die above the first redistribution structure, a
second die above the first die, a heat dissipation unit on side
surfaces of the first die or the second die, and a second
redistribution structure above the second die. The semicon-
ductor package includes a first post protruding from an
upper surface of the first redistribution structure and extend-
ing to a lower surface of the second redistribution structure,
a second post connecting the heat dissipation unit with a heat
dissipation redistribution structure as a thermal path, and a
molding unit filling an empty space between the first redis-
tribution structure and the second redistribution structure.
An outer pad of the heat dissipation redistribution structure
is exposed to an outside of the semiconductor package, and
an inner pad of the heat dissipation redistribution structure
is in contact with the second post.

20 Claims, 23 Drawing Sheets

(51) Int. Cl.
*H01L 23/498* (2006.01)
*H01L 25/16* (2023.01)
*H10B 80/00* (2023.01)
*H01L 23/00* (2006.01)

(52) U.S. Cl.
CPC .............. *H01L 24/08* (2013.01); *H01L 24/16* (2013.01); *H01L 2224/08145* (2013.01); *H01L 2224/16227* (2013.01); *H01L 2924/1431* (2013.01); *H01L 2924/1436* (2013.01)

(56) References Cited

U.S. PATENT DOCUMENTS

| | | | |
|---|---|---|---|
| 8,629,546 B1 * | 1/2014 | Scanlan | ................... H01L 24/19 |
| | | | 257/784 |
| 8,759,962 B2 * | 6/2014 | Su | ......................... H01L 23/055 |
| | | | 257/772 |
| 8,785,299 B2 | 7/2014 | Mao et al. | |
| 8,884,431 B2 | 11/2014 | Lin et al. | |
| 9,070,656 B2 | 6/2015 | Hooper et al. | |
| 9,368,438 B2 | 6/2016 | Lin et al. | |
| 9,478,474 B2 * | 10/2016 | Chen | ................... H01L 23/3128 |
| 10,068,875 B2 | 9/2018 | Hembree | |
| 10,916,527 B2 | 2/2021 | Vadhavkar et al. | |
| 2021/0066279 A1 | 3/2021 | Yu et al. | |
| 2024/0006270 A1 * | 1/2024 | Kuo | ......................... H01L 24/13 |

* cited by examiner

SEMICONDUCTOR PACKAGE

CROSS-REFERENCE TO RELATED APPLICATION

This application claims priority under 35 U.S.C. § 119 to Korean Patent Application No. 10-2022-0081507, filed on Jul. 1, 2022, in the Korean Intellectual Property Office, the disclosure of which is incorporated by reference herein in its entirety.

BACKGROUND

Some example embodiments of the inventive concepts relate to a semiconductor package, including a semiconductor package from which heat is easily dissipated.

While the storage capacity of the semiconductor chip increases in capacity, it is desired or required that the semiconductor package including the semiconductor chip should be thin and light. In addition, studies are being conducted to include semiconductor chips with various functions in the semiconductor package and to quickly drive the semiconductor chips. With such a trend, the desire or need for miniaturization and multi-functionality of semiconductor chips used in electronic components has increased. In addition, in the package field, studies on ways to dissipate heat inside the semiconductor package while miniaturizing the size based on small semiconductor chips are being actively conducted.

SUMMARY

Some example embodiments of the inventive concepts provide a semiconductor package excellent for heat dissipation.

Further, technical ideas of the inventive concepts are not limited to the above-mentioned tasks, and other tasks may be clearly understood by a person skilled in the art from the following description.

According to an example embodiment of the inventive concepts, a semiconductor package includes a first redistribution structure including a first inner pad, a first outer pad, and a first redistribution line, the first redistribution line connecting the first inner pad to the first outer pad, a first die above the first redistribution structure, the first die including an active surface having a first area, and a second die above the first die, the second die including an active surface having a second area, the second area different from the first area. The semiconductor package includes a heat dissipation unit on side surfaces of whichever one of the first die and the second die has an active surface with a smaller area, a second redistribution structure above the second die, the second redistribution structure including a second inner pad, a second outer pad, and a second redistribution line, the second redistribution line connecting the second inner pad and the second outer pad, a first post protruding from an upper surface of the first redistribution structure and extending to a lower surface of the second redistribution structure, a second post connecting the heat dissipation unit with a heat dissipation redistribution structure as a thermal path, and a molding unit filling an empty space between the first redistribution structure and the second redistribution structure. The heat dissipation redistribution structure comprises whichever one of the first redistribution structure and the second redistribution structure is closer to the heat dissipation unit, an outer pad of the heat dissipation redistribution structure is exposed to an outside of the semiconductor package, an inner pad of the heat dissipation redistribution structure is in contact with the second post, and the heat dissipation unit includes silicon having a thermal conductivity higher than a thermal conductivity of the molding unit.

According to another example embodiment of the inventive concepts, a semiconductor package includes a first redistribution structure including a first inner pad, a first outer pad, and a first redistribution line, the first redistribution line connecting the first inner pad to the first outer pad, a first die above the first redistribution structure, the first die including an active surface having a first area, a second die above the first die, the second die including an active surface having a second area, the second area different from the first area, a heat dissipation unit located on side surfaces of whichever of the first die and the second die has an active surface with a smaller area, and a second redistribution structure above the second die, the second redistribution structure including a second inner pad, a second outer pad, and a second redistribution line, the second redistribution line connecting the second inner pad to the second outer pad. The semiconductor package includes a first post protruding from an upper surface of the first redistribution structure and extending to a lower surface of the second redistribution structure, and a molding unit filling an empty space between the first redistribution structure and the second redistribution structure. A heat redistribution structure comprises whichever one of the first redistribution structure and the second redistribution structure is closer to the heat dissipation unit, an outer pad of the heat dissipation redistribution structure is exposed to an outside of the semiconductor package, and the heat dissipation unit includes silicon having a higher thermal conductivity than a thermal conductivity of the molding unit, to transfer heat to the heat dissipation redistribution structure.

According to another example embodiment of the inventive concepts, a semiconductor package includes a first redistribution structure including a first inner pad, a first outer pad, and a first redistribution line, the first redistribution line connecting the first inner pad to the first outer pad, a first die above the first redistribution structure, the first die including an active surface having a first area, a second die above the first die, the second die including an active surface having a second area, the second area smaller than the first area, a heat dissipation unit on side surfaces of the second die, the heat dissipation unit including at least one copper pillar, and a second redistribution structure above the second die, the second redistribution structure including a second inner pad, a second outer pad, and a second redistribution line, the second redistribution line connecting the second inner pad to the second outer pad. The semiconductor package includes a first post protruding from an upper surface of the first redistribution structure and extending to a lower surface of the second redistribution structure, a plurality of second posts connecting the heat dissipation unit to the second redistribution structure as a thermal path, and a molding unit filling an empty space between the first redistribution structure and the second redistribution structure. The heat dissipation unit includes silicon having a higher thermal conductivity than a thermal conductivity of the molding unit, the second outer pad of the second redistribution structure is exposed to an outside of the semiconductor package, and the second inner pad of the second redistribution structure is in contact with the second post, the first post is configured to contact the first inner pad and the second inner pad to electrically connect the first redistribution structure and the second redistribution structure to each other, and the second post is configured to contact the heat dissipation unit and another second inner pad of the second redistribution structure which is not in contact with the first post, and the heat dissipation unit and the second redistribution structure are thermally connected to each other.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Figure 1:
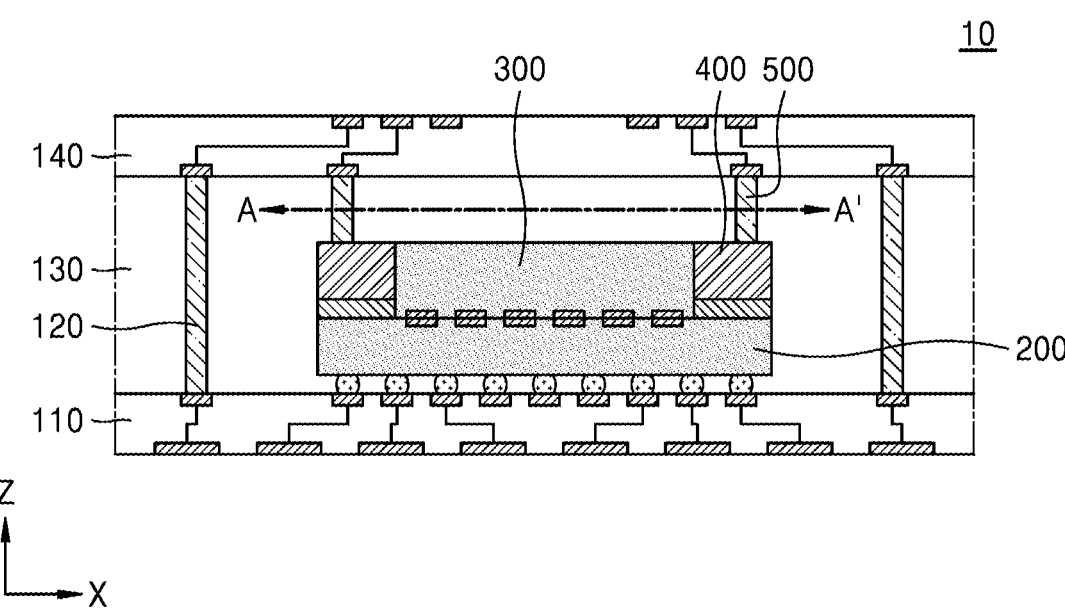
FIG. 1 is a cross-sectional view schematically illustrating a semiconductor package according to an example embodiment.

Since the example embodiments may be modified in various ways and may have various forms, some example embodiments are illustrated in the drawings and described in detail. However, it is not intended to limit the example embodiments to the particular disclosed forms.

FIG. 1 is a cross-sectional view schematically illustrating a semiconductor package 10 according to an example embodiment.

Referring to FIG. 1, the semiconductor package 10 may include a first redistribution structure 110, a first post 120, a molding unit 130, a second redistribution structure 140, a first die 200, a second die 300, a heat dissipation unit 400, and a second post 500.

The first redistribution structure 110 and the second redistribution structure 140 may include at least one redistribution insulating layer and a plurality of redistribution patterns. The plurality of redistribution patterns may include a plurality of redistribution line patterns and a plurality of redistribution vias.

For example, the first redistribution structure 110 and the second redistribution structure 140 may include a plurality of stacked redistribution insulating layers. The redistribution insulating layer may further include an insulating material, for example, a photo-imageable dielectric (PID) resin, a photosensitive polyimide, and/or an inorganic filler.

The redistribution patterns may include a plurality of redistribution line patterns and a plurality of redistribution vias. For example, the redistribution patterns may be formed of a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof, but example embodiments are not limited thereto.

The plurality of redistribution line patterns and the plurality of redistribution vias may be manufactured through an exposure process and a development process of a photosensitive insulating material. In some example embodiments, the plurality of redistribution patterns may be formed by stacking a metal or an alloy of the metal on a seed layer including titanium, titanium nitride, and/or titanium tungsten.

The plurality of redistribution line patterns may be arranged on at least one of an upper surface and a lower surface of the redistribution insulating layer. The plurality of redistribution vias may be connected in contact with some of the plurality of redistribution line patterns by passing through at least one redistribution insulating layer. In some example embodiments, at least some of the plurality of redistribution line patterns may be formed together with some of the plurality of redistribution vias to form a single body. For example, the redistribution line pattern and the redistribution via in contact with the upper surface of the redistribution line pattern may be integrated.

The plurality of redistribution patterns including the plurality of redistribution line patterns and the plurality of redistribution vias may be formed by a plating scheme. For example, the plurality of redistribution patterns may be formed by a plating scheme, such as immersion plating, electroless plating, or electroplating.

The first redistribution structure 110 may include a first inner pad, a first outer pad, and a first redistribution line. The first redistribution line may connect the first inner pad with the first outer pad. The second redistribution structure 140 may include a second inner pad, a second outer pad, and a second redistribution line. The second redistribution line may connect the second inner pad with the second outer pad. The first outer pad and the second outer pad may be exposed to the outside.

The first die 200 may be located above the first redistribution structure 110. The first die 200 may include an active surface and an inactive surface facing the active surface. An area of the active surface of the first die 200 may be a first area. The first die 200 may transmit an electrical signal to the first redistribution structure 110 through flip-bonding. The first die 200 may have through electrodes. The through electrodes may be through silicon vias (TSVs) having a structure penetrating silicon of the dies.

The second die 300 may be located above the first die 200. The second die 300 may include an active surface and an inactive surface facing the active surface. An area of the active surface of the second die 300 may be a second area. The second area may be different from the first area. The dies may have different lengths in both the X-axis direction and the Y-axis direction. Alternatively, the dies may have different lengths in the X-axis direction or the Y-axis direction.

A plurality of connection terminals may be attached to the second die 300. The active surface of the second die 300 may be electrically connected to the first redistribution structure 110 through a connection terminal of the second die 300 and a TSV of the first die 200. In addition, the second die 300 may be electrically connected to the first redistribution structure 110 through a Cu—Cu hybrid bonding to the first die 200.

In some example embodiments, the first die 200 may not include a memory cell. The first die 200 may include a test logic circuit, such as a serial-parallel conversion circuit, a design for test (DFT), a joint test action group (JTAG), a memory built-in self-test (MBIST), and a signal interface circuit, such as PHY, but example embodiments are not limited thereto.

In some example embodiments, the first die 200 may be a buffer chip for controlling a high bandwidth memory dynamic random access memory (HBM DRAM), and the second die 300 may be a memory cell chip having a cell of HBM DRAM controlled by the first die 200. The first die 200 may be referred to as a buffer chip or a master chip, and the second die 300 may be referred to as a slave chip or a memory cell chip. Both the first die 200 and the second die 300 may be referred to as HBM DRAM devices.

The second redistribution structure 140 may be arranged above the second die 300. Each of the first posts 120 may protrude from the upper surface of the first redistribution structure 110 and extend to a lower surface of the second redistribution structure 140. The second redistribution structure 140 may be electrically connected to the first redistribution structure 110 through the first posts 120. The second redistribution structure 140 may be electrically connected to the second die 300 through the redistribution via and the redistribution line pattern. However, the example embodiments are not limited thereto, and the second redistribution structure 140 may include a die located thereon to transfer an electrical signal to the die.

The molding unit 130 may fill an empty space between first redistribution structure 110 and the second redistribution structure 140. The molding unit 130 may include an insulating body. For example, an epoxy molding compound (EMC) may be included as a material of the molding unit 130. The molding unit 130 may increase structural stability of the semiconductor package and prevent a short circuit between dies.

The heat dissipation unit 400 may be located on side surfaces of a die having an active surface of a smaller area among the first die 200 and the second die 300. The sum of the length of the heat dissipation unit 400 in the X-axis (or Y-axis) direction and the length of the die in the X-axis (or Y-axis) direction, the die having an active surface of a smaller area, may be equal or substantially equal to the length of a die in the X-axis (or Y-axis) direction, the die having an active surface of a larger area among the first die 200 and the second die 300. However, the example embodiments are not limited thereto, and the sum of the length of the heat dissipation unit 400 in the X-axis (or Y-axis) direction and the length of the die in the X-axis (or Y-axis) direction, the die having an active surface of a smaller area, may be different from the length of the die in the X-axis (or Y-axis) direction, the die having an active surface of a larger area among the first die 200 and the second die 300. As the area of the heat dissipation unit 400 increases, the heat generated from the die may be easily discharged.

As a constituent material of the heat dissipation unit 400, silicon having higher thermal conductivity than that of the molding unit 130 may be included. For example, bulk silicon or the like may be included as a constituent material of the heat dissipation unit 400. A substance constituting the molding unit 130 may have low thermal conductivity. Heat generated in the semiconductor package 10 may be discharged through the molding unit 130, but heat dissipation is difficult due to low thermal conductivity. The semiconductor package 10 may be heat-dissipated through the heat dissipation unit 400 on the side surfaces of the die as well as through the molding unit 130 on the upper or lower part of the die. The semiconductor package 10 may transfer heat generated from the die to a redistribution structure through the heat dissipation unit 400, thereby being excellent in heat dissipation.

Figure 6:
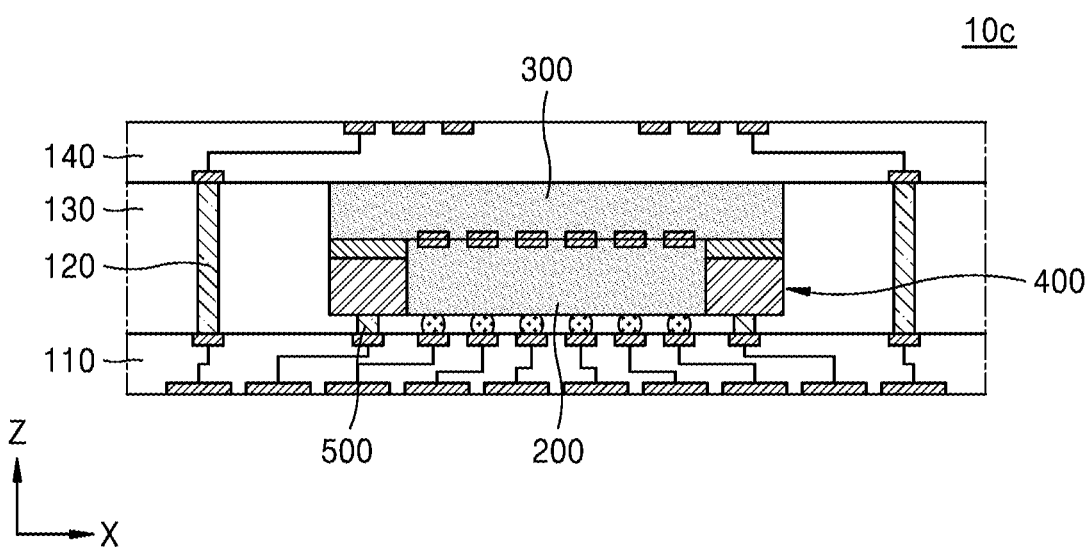
FIG. 6 is a cross-sectional view schematically illustrating a semiconductor package according to another example embodiment of the inventive concepts.

The redistribution structure adjacent to the heat dissipation unit 400 in the first redistribution structure 110 and the second redistribution structure 140 is referred to as a heat dissipation redistribution structure. Referring to FIG. 1, since the area of the active surface of the second die 300 is smaller than the area of the active surface of the first die 200, the heat dissipation unit 400 is located on the side surfaces of the second die 300. In some example embodiments, the heat dissipation redistribution structure becomes the second redistribution structure 140. Referring to FIG. 6, since the area of the active surface of the first die 200 is smaller than the area of the active surface of the second die 300, the heat dissipation unit 400 is located on the side surfaces of the first die 200. In some example embodiments, the heat dissipation redistribution structure becomes the first redistribution structure 110.

The second posts 500 may connect the heat dissipation unit 400 with the heat dissipation redistribution structure. The area of the bottom surface of each of the second posts 500 may be different from the area of the upper surface of the heat dissipation unit 400. The area of the bottom surface of each of the second posts 500 may be smaller than the area of the upper surface of the heat dissipation unit 400. Heat generated by the first die 200 and the second die 300 may be discharged to the outside through the second posts 500, thereby effectively dissipating heat compared to a semiconductor package that emits heat through EMC.

Referring to FIGS. 1 to 5, an example embodiment of a semiconductor package in which the area of the active surface of the second die 300 is smaller than that of the active surface of the first die 200 will be described in detail.

Figure 2:
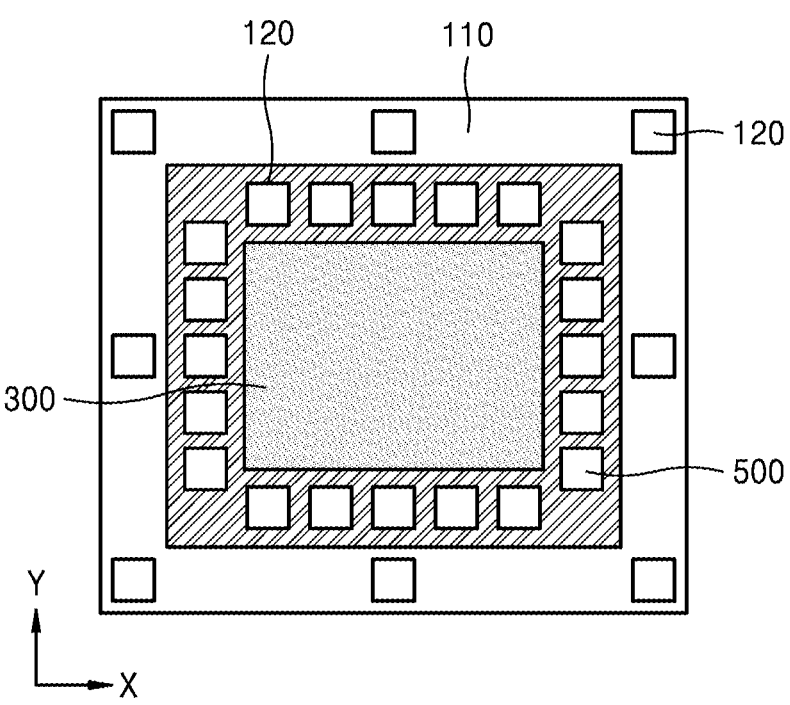
FIGS. 2 and 3 are horizontal cross-sectional views taken along line A-A' of the semiconductor package of FIG. 1 according to an example embodiment of the inventive concepts, assuming that a molding unit is transparent.
Figure 3:
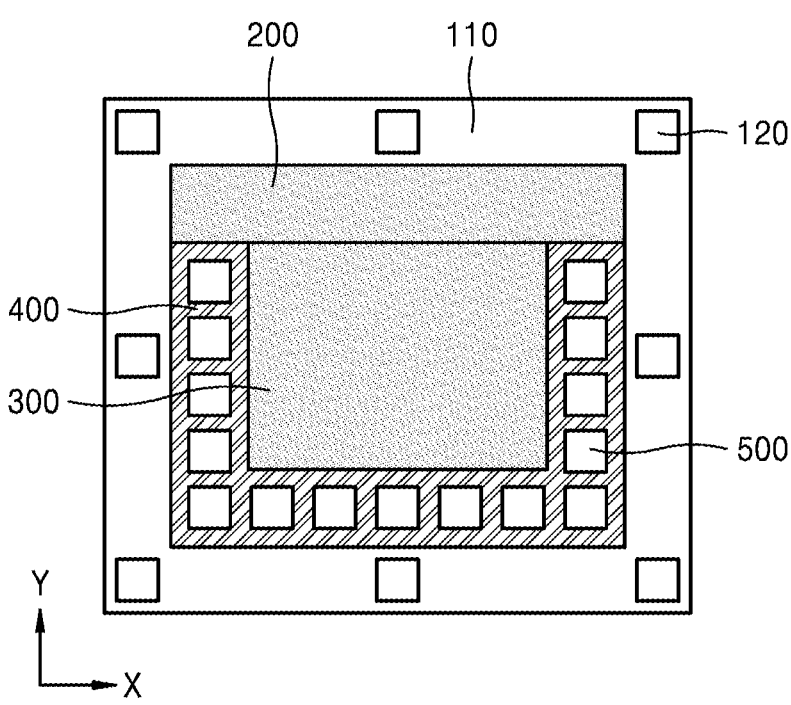

FIG. 1 is a cross-sectional view schematically illustrating a semiconductor package 10 according to an example embodiment of the inventive concepts. FIGS. 2 and 3 are horizontal cross-sectional views taken along line A-A' of the semiconductor package 10 of FIG. 1, assuming that a molding unit 130 according to an example embodiment of the inventive concepts is transparent.

Referring to FIG. 1, the heat dissipation unit 400 may be disposed on side surfaces of the second die 300. The heat dissipation unit 400 may be located above the first die 200. The heat dissipation redistribution structure is the second redistribution structure 140. The second posts 500 may connect the heat dissipation unit 400 with the second redistribution structure 140.

Referring to FIGS. 2 and 3, the heat dissipation unit 400 may surround at least one side surface of the second die 300. In some example embodiments, the heat dissipation unit 400 may surround all side surfaces of the second die 300. The heat dissipation unit 400 may be located at a portion where the first die 200 and the second die 300 do not overlap each other on the upper surface of the first die 200. In some example embodiments, the heat dissipation unit 400 may be located in all portions of the top surface of the first die 200 in which the first die 200 and the second die 300 do not overlap.

Referring to FIGS. 1 and 2, the semiconductor package 10 may include at least one of the first posts 120 and at least one of the second posts 500. Each of the first posts 120 may electrically connect the first redistribution structure 110 with the second redistribution structure 140. Specifically, the first redistribution structure 110 may include a plurality of first inner pads, first outer pads, and first redistribution lines respectively connecting the first inner pads with the first outer pads. The second redistribution structure 140 may include a plurality of second inner pads, second outer pads, and second redistribution lines respectively connecting the second inner pads with the second outer pads. The first post 120 may be in contact with the first inner pad at an end thereof, and may be in contact with the second inner pad at the other end opposite thereto. Each of the first posts 120 may electrically connect the first redistribution structure 110 with the second redistribution structure 140 through the contacts. In some example embodiments, the substance constituting the first posts 120 may include copper, an alloy thereof, or the like.

The second posts 500, as thermal paths, may connect the heat dissipation unit 400 with the second redistribution structure 140. Specifically, the second posts 500 may be in contact with an inner pad which is not in contact with the first posts 120 among the inner pads of the second redistribution structure 140. In addition, the second posts 500 may be in contact with the heat dissipation unit 400. The second posts 500 may thermally connect the heat dissipation unit 400 with the second redistribution structure 140. In some example embodiments, the substance constituting the second posts may include copper, an alloy thereof, or the like.

Heat generated by the first die 200 and the second die 300 may be transferred to the heat dissipation unit 400 having high thermal conductivity, and heat transferred to the heat dissipation unit 400 may be transferred to the second inner pads of the second redistribution structure 140 through the second posts 500. The heat transferred to the second inner pads may be transferred to the second outer pads along the second redistribution line to be emitted to the outside. Through this heat transfer process, heat generated from the first die 200 and the second die 300 may be effectively discharged to the outside.

Figure 4:
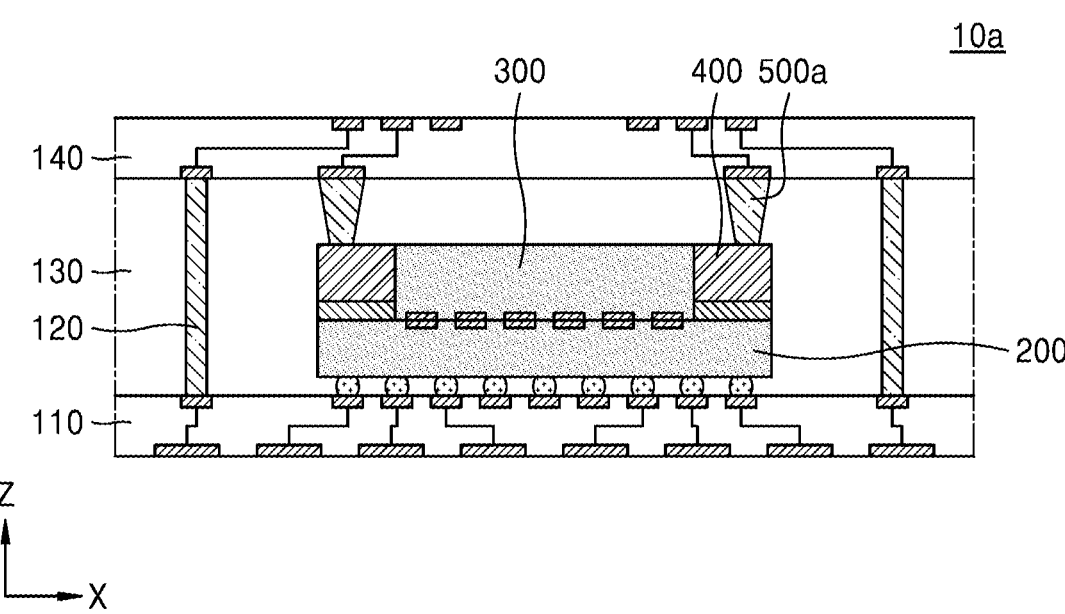
FIG. 4 is a cross-sectional view schematically illustrating a semiconductor package according to another example embodiment of the inventive concepts.

FIG. 4 is a cross-sectional view schematically illustrating a semiconductor package 10a according to another example embodiment of the inventive concepts.

Referring to FIG. 4, when the second posts 500a approaches the heat dissipation redistribution structure, the horizontal widths of the second posts 500a may increase. Specifically, the second posts 500a may have a trapezoidal cross-section in which a horizontal widths become wider as the second posts 500a approach the second redistribution structure 140. When heat is transferred from high temperature to low temperature, the larger the area to which heat is transferred, the more heat is transferred. In the process of discharging heat generated by the first die 200 and the second die 300 to the outside through the second posts 500a, the second posts 500a may transfer a larger amount of heat as the widths of the second posts 500a increase. The second posts 500a each having a vertical cross-section of a trapezoidal shape may transfer a large amount of heat to the second redistribution structure 140 so that heat generated from the semiconductor package 10a may be efficiently dissipated to the outside.

Figure 5:
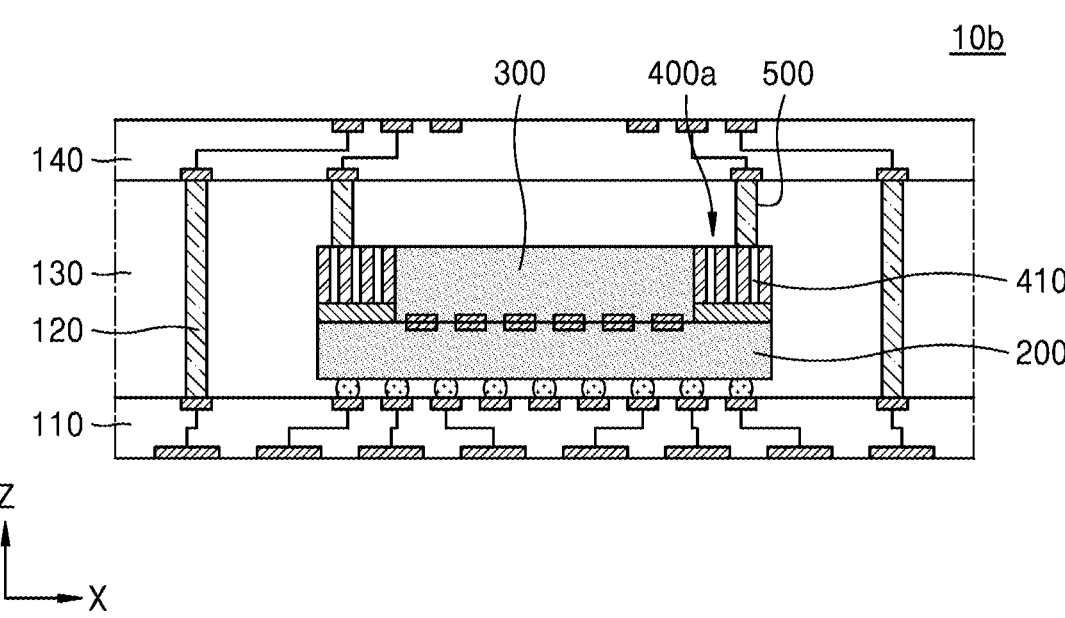
FIG. 5 is a cross-sectional view schematically illustrating a semiconductor package according to another example embodiment of the inventive concepts.

FIG. 5 is a cross-sectional view schematically illustrating a semiconductor package 10b according to another example embodiment of the inventive concepts.

Referring to FIG. 5, the heat dissipation unit 400a may include at least one copper pillar 410 therein. The copper pillar 410 may be formed in the heat dissipation unit 400a through a via process. The thermal conductivity of the copper pillar 410 may be higher than the thermal conductivity of silicon. The copper pillar 410 may transfer heat collected by the heat dissipation unit 400a to the second redistribution structure 140 through the second post 500. In addition, the copper pillar 410 may transfer heat collected by the heat dissipation unit 400a to the second redistribution structure 140 through the EMC. Heat generated in the semiconductor package 10b may be effectively discharged to the outside.

Figure 7:
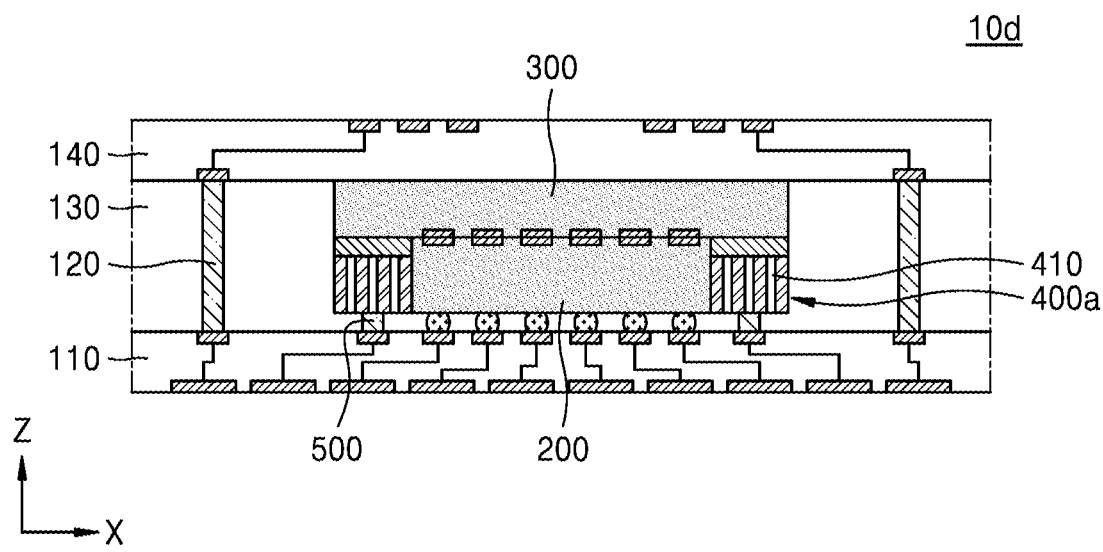
FIG. 7 is a cross-sectional view schematically illustrating a semiconductor package according to another example embodiment of the inventive concepts.

Referring to FIGS. 6 and 7, an example embodiment of the semiconductor package in which the area of the active surface of the second die 300 is larger than the area of the active surface of the first die 200 will be described in detail.

FIG. 6 is a cross-sectional view schematically illustrating a semiconductor package 10c according to another example embodiment of the inventive concepts.

Referring to FIG. 6, the heat dissipation unit 400 may be located on the side surfaces of the first die 200. The second die 300 may be located above the heat dissipation unit 400. The heat dissipation redistribution structure is the first redistribution structure 110. The second posts may connect the heat dissipation unit with the first redistribution structure 110.

The semiconductor package 10c may include at least one of first posts 120 and at least one of second posts 500. Each of the first posts 120 may electrically connect the first redistribution structure 110 with the second redistribution structure 140. The first post 120 may be in contact with the first inner pad at an end thereof, and may be in contact with the second inner pad at the other end opposite thereto. Each of the first posts 120 may electrically connect the first redistribution structure 110 with the second redistribution structure 140 through the contacts. In some example embodiments, the substance constituting the first posts may include copper, an alloy thereof, or the like.

The second posts 500, as thermal paths, may connect the heat dissipation unit 400 with the first redistribution structure 110. Specifically, the second posts 500 may be in contact with an inner pad which is not in contact with the first posts 120 among the inner pads of the first redistribution structure 110. In addition, the second posts 500 may be in contact with the heat dissipation unit 400. The second posts 500 may thermally connect the heat dissipation unit 400 with the first redistribution structure 110. In some example embodiments, the substance constituting the second posts may include copper, an alloy thereof, or the like.

Heat generated by the first die 200 and the second die 300 may be transferred to the heat dissipation unit 400 having high thermal conductivity, and heat transferred to the heat dissipation unit 400 may be transferred to the first inner pads of the first redistribution structure 110 through the second posts 500. The heat transferred to the first inner pad may be transferred to the first outer pad along the first redistribution line to be emitted to the outside. Through this heat transfer process, heat generated from the first die 200 and the second die 300 may be effectively discharged to the outside.

FIG. 7 is a cross-sectional view schematically illustrating a semiconductor package 10*d* according to another example embodiment of the inventive concepts.

Referring to FIG. 7 the heat dissipation unit 400*a* may include at least one copper pillar 410 therein. The copper pillar 410 may be formed in the heat dissipation unit 400*a* through a via process. The thermal conductivity of the copper pillar 410 may be higher than the thermal conductivity of silicon. In addition, the copper pillar 410 may transfer heat collected by the heat dissipation unit 400*a* to the first redistribution structure 110 through the second post 500. In addition, the copper pillar 410 may transfer heat collected by the heat dissipation unit 400*a* to the first redistribution structure 110 through the EMC as well as the second post 500. The heat generated in the semiconductor package 10*d* may be effectively discharged to the outside.

Figure 8:
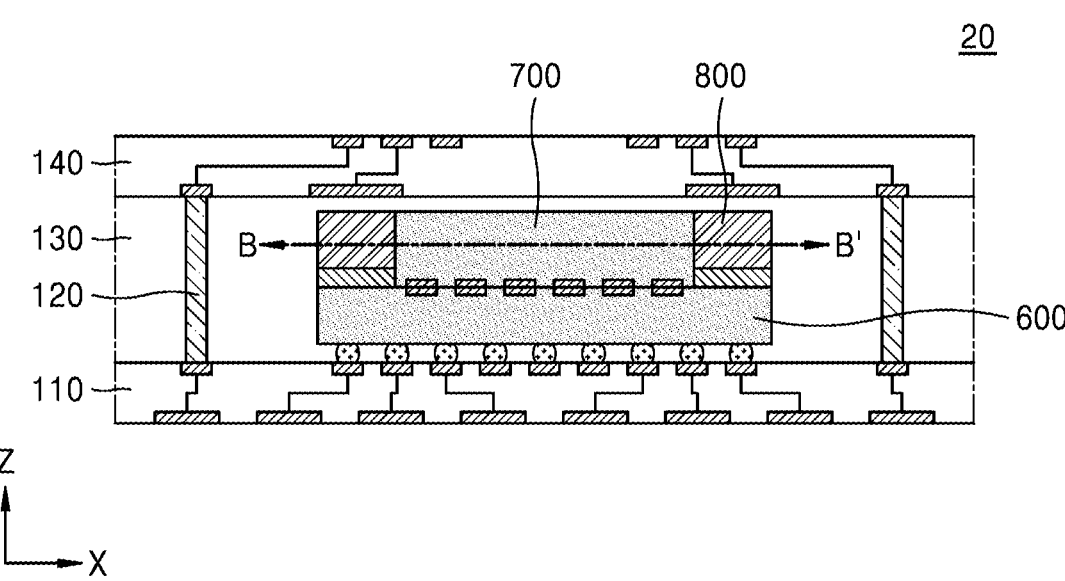
FIG. 8 is a cross-sectional view schematically illustrating a semiconductor package according to an example embodiment of the inventive concepts.

FIG. 8 is a cross-sectional view schematically illustrating a semiconductor package 20 according to an example embodiment of the inventive concepts.

Referring to FIG. 8, the semiconductor package 20 may include a first redistribution structure 110, first posts 120, a molding unit 130, a second redistribution structure 140, a first die 600, a second die 700, and a heat dissipation unit 800.

The first redistribution structure 110, the first posts 120, the molding unit 130, the second redistribution structure 140, the first die 600, and the second die 700 correspond to the first redistribution structure 110, the first posts 120, the molding unit 130, the second redistribution structure 140, the first die 200 (see FIG. 1), and the second die 300 (see FIG. 1), which have been described with reference to FIG. 1. The heat dissipation unit (e.g., 400 of FIG. 1) described with reference to FIG. 1 will be described in detail with reference to FIG. 8.

The heat dissipation unit 800 may be located on side surfaces of a die having an active surface of a smaller area among the first die 600 and the second die 700. As the area of the heat dissipation unit 800 increases, the heat generated from the die may be easily discharged. As a constituent material of the heat dissipation unit 800, silicon having higher thermal conductivity than that of the molding unit 130 may be included. In some example embodiments, bulk silicon or the like may be included as a constituent material of the heat dissipation unit 800. The semiconductor package 20 may be heat-dissipated through the heat dissipation unit 800 on the side surfaces of the die as well as through the molding unit 130 on the upper or lower part of the die. The semiconductor package 20 may transfer heat generated from the die to a heat dissipation redistribution structure through the heat dissipation unit 800, thereby being excellent in heat dissipation.

The heat dissipation unit 800 may be thermally connected to the first die 600 to receive heat from the first die 600. The heat dissipation unit 800 may be thermally connected to the second die 700 to receive heat from the second die 700. In some example embodiments, the heat dissipation unit 800 may not be electrically connected to the first die 600 and the second die 700.

The heat dissipation unit 800 may not be electrically connected to the heat dissipation redistribution structure. The heat dissipation unit 800 may not contact the heat dissipation redistribution structure. The heat dissipation unit 800 may transfer heat to the heat dissipation redistribution structure through the EMC, to then be discharged to the outside. An area for transferring heat through the heat dissipation unit 800 may be increased, and heat generated in the semiconductor package 20 may be effectively dissipated to the outside.

Referring to FIGS. 8 to 13, an example embodiment of a semiconductor package in which the area of the active surface of the second die 700 is smaller than that of the active surface of the first die 600 will be described in detail.

Figure 9:
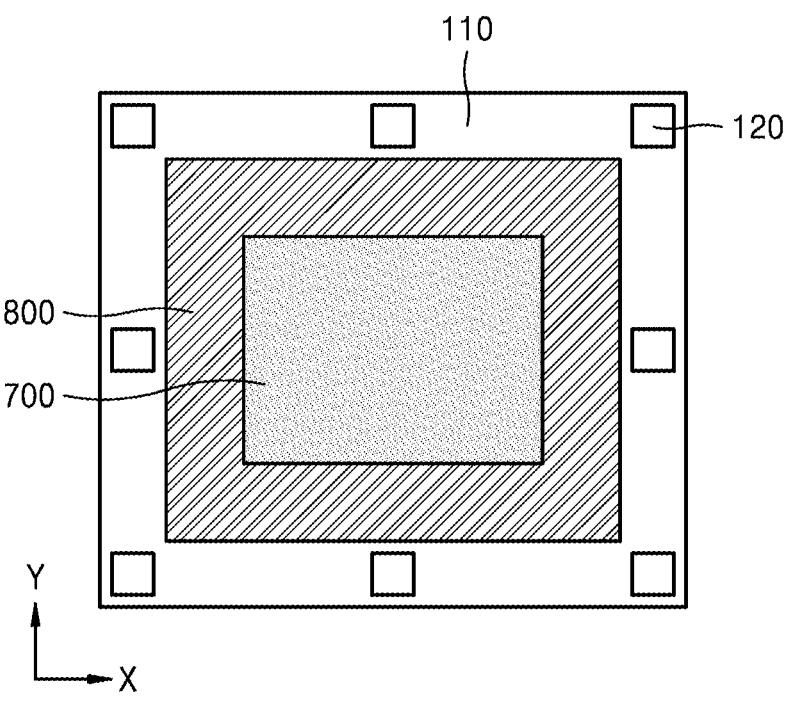
FIGS. 9 and 10 are horizontal cross-sectional views taken along line B-B' of the semiconductor package of FIG. 7 according to an example embodiment of the inventive concepts, assuming that a molding unit is transparent.
Figure 10:
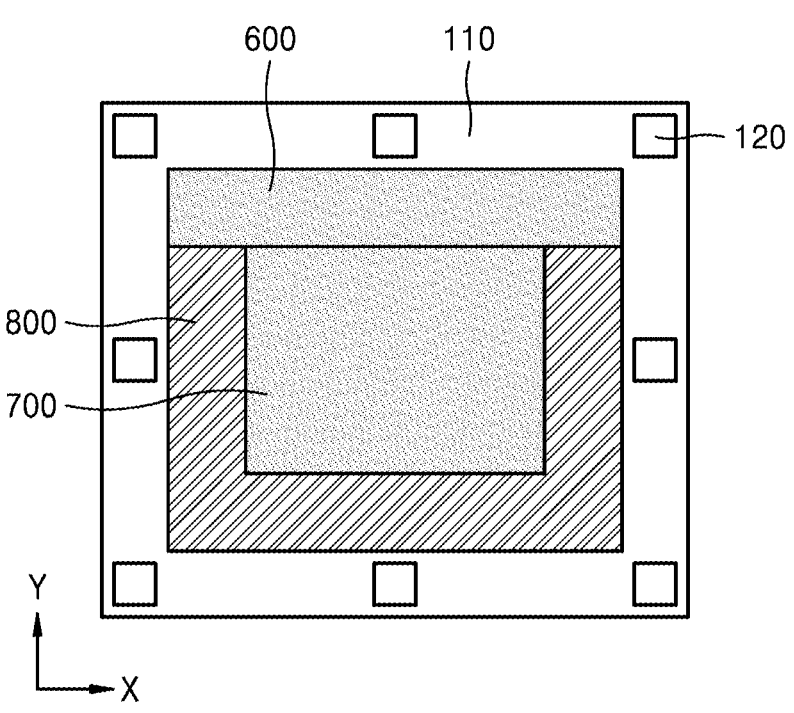

FIG. 8 is a cross-sectional view schematically illustrating a semiconductor package 20 according to an example embodiment of the inventive concepts. FIGS. 9 and 10 are horizontal cross-sectional views taken along line B-B' of the semiconductor package 20 of FIG. 8, according to the inventive concepts, assuming that the molding unit 130 is transparent.

Referring to FIG. 8, the heat dissipation unit 800 may be located on the side surfaces of the second die 700. The heat dissipation unit 800 may be located above the first die 600. The heat dissipation redistribution structure is the second redistribution structure 140. The heat dissipation unit 800 may be bonded to an upper portion of the first die 600 using a substance having a thermal conductivity in a range of about 10 W/m·K to about 100 W/m·K. A thermal interface material (TIM) is an example of a material having the thermal conductivity. In addition, the heat dissipation unit 800 may be bonded to the first die 600 on the upper portion of the first die 600 through a solder, a silver paste, and the like.

Referring to FIGS. 9 and 10, the heat dissipation unit 800 may surround at least one side surface of the second die 700. In some example embodiments, the heat dissipation unit 800 may surround all side surfaces of the second die 700. The heat dissipation unit 800 may be located at a portion where the first die 600 and the second die 700 do not overlap each other on the upper surface of the first die 600. In some example embodiments, the heat dissipation unit 800 may be located in all portions of the upper surface of the first die 600 in which the first die 200 and the second die 300 do not overlap.

The substance constituting the heat dissipation unit 800 may include silicon having the same thermal expansion rate as that of the first die 600. The volume expansion rate by heat is different for each material. Due to this characteristic, when the heat dissipation unit 800 is formed of a material having a different thermal expansion rate, the thermal connection between the heat dissipation unit 800 and the first die 600 may be weakened by the heat generated from the first die 600 and the second die 700. In addition, the heat dissipation unit 800 may include silicon having a thermal expansion rate of about 10% or less than the thermal expansion rate of the first die 600.

Referring to FIGS. 8 and 9, the semiconductor package 20 may include at least one first post 120. Each of the first posts 120 may electrically connect the first redistribution structure 110 with the second redistribution structure 140. Specifically, the first post 120 may be in contact with the first inner pad at an end thereof, and may be in contact with the second inner pad at the other end opposite thereto. Each of the first posts 120 may electrically connect the first redistribution structure 110 with the second redistribution structure 140 through the contacts. In some example embodiments, the substance constituting the first posts 120 may include copper, an alloy thereof, or the like.

Figure 11:
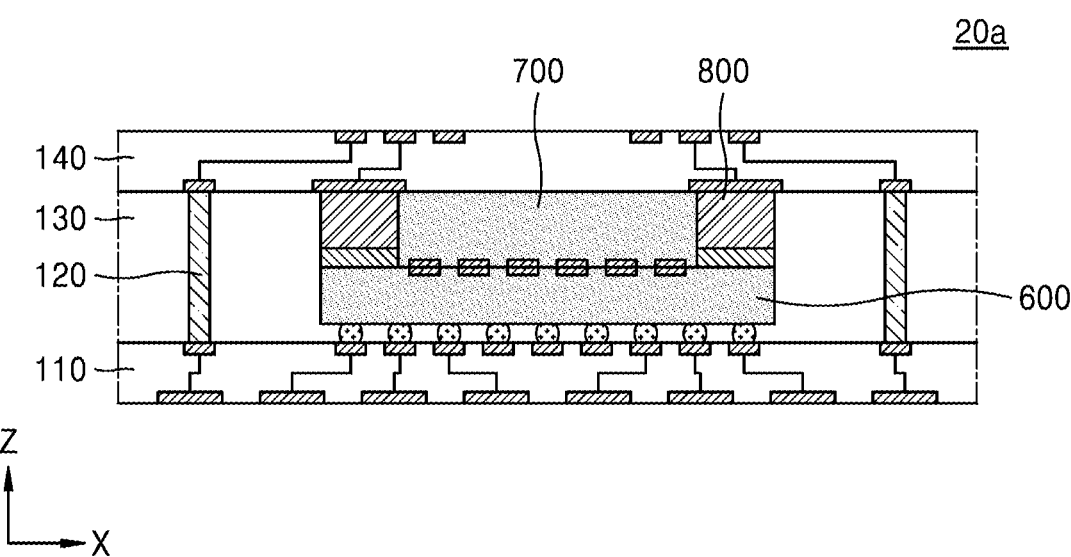
FIG. 11 is a cross-sectional view schematically illustrating a semiconductor package according to another example embodiment of the inventive concepts.

FIG. 11 is a cross-sectional view schematically illustrating a semiconductor package according to another example embodiment of the inventive concepts.

Referring to FIG. 11, the heat dissipation unit 800 may be connected to a heat dissipation redistribution structure. In an example embodiment, the heat dissipation unit 800 may contact the second inner pad of the second redistribution structure 140, and the heat dissipation unit 800 may be connected to the second redistribution structure 140. The heat dissipation unit 800 may transfer heat through the second inner pad, and the heat transferred to the second inner pad may be transferred to the second outer pad through the second redistribution line. Heat generated from the semiconductor package 20a may be effectively dissipated to the outside through the heat dissipation unit 800 in contact with the heat dissipation redistribution structure. The heat dissipation unit 800 and the heat dissipation redistribution structure may be thermally connected to each other and may not be electrically connected to each other.

Figure 12:
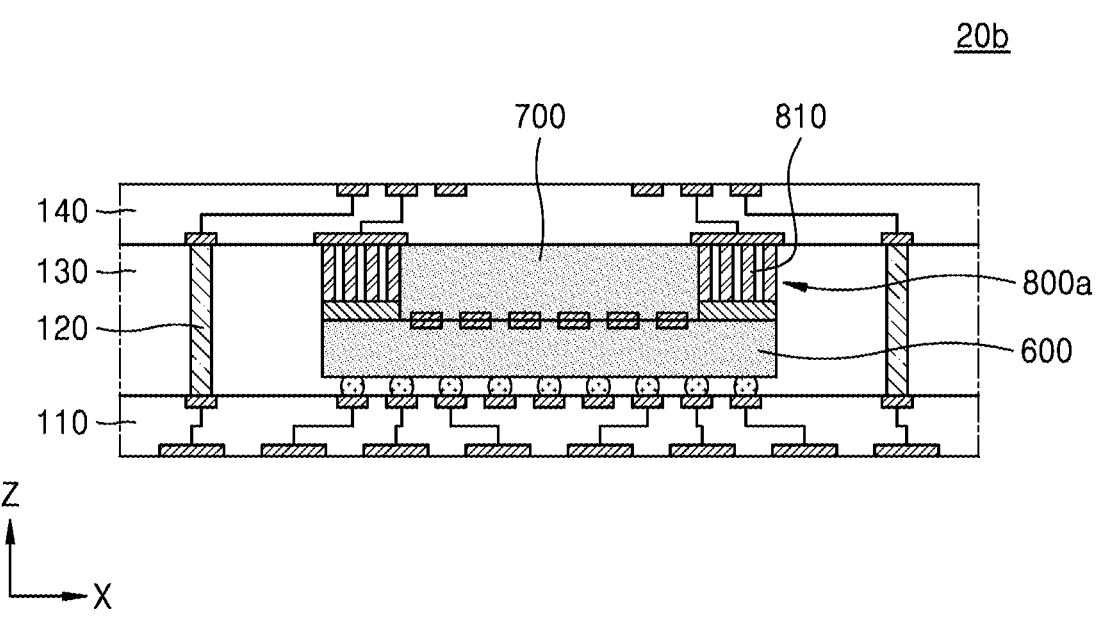
FIG. 12 is a cross-sectional view schematically illustrating a semiconductor package according to another example embodiment of the inventive concepts.

FIG. 12 is a cross-sectional view schematically illustrating a semiconductor package according to another example embodiment of the inventive concepts.

Referring to FIG. 12, the heat dissipation unit 800a may include at least one copper pillar 810 therein. The copper pillar 810 may be formed in the heat dissipation unit 800a through a via process. The copper pillar 810 may collect heat generated from the first die 600 and the second die 700 into the heat dissipation unit 800a. In some example embodiments, the heat collected in the heat dissipation unit 800a through the copper pillar 810 may be transferred to the second redistribution structure 140 through the EMC. In some example embodiments, the heat collected by the heat dissipation unit 800a through the copper pillar 810 may be transferred to the second redistribution structure 140 through the second inner pad. Heat generated in the semiconductor package 20b may be effectively discharged to the outside.

Figure 13:
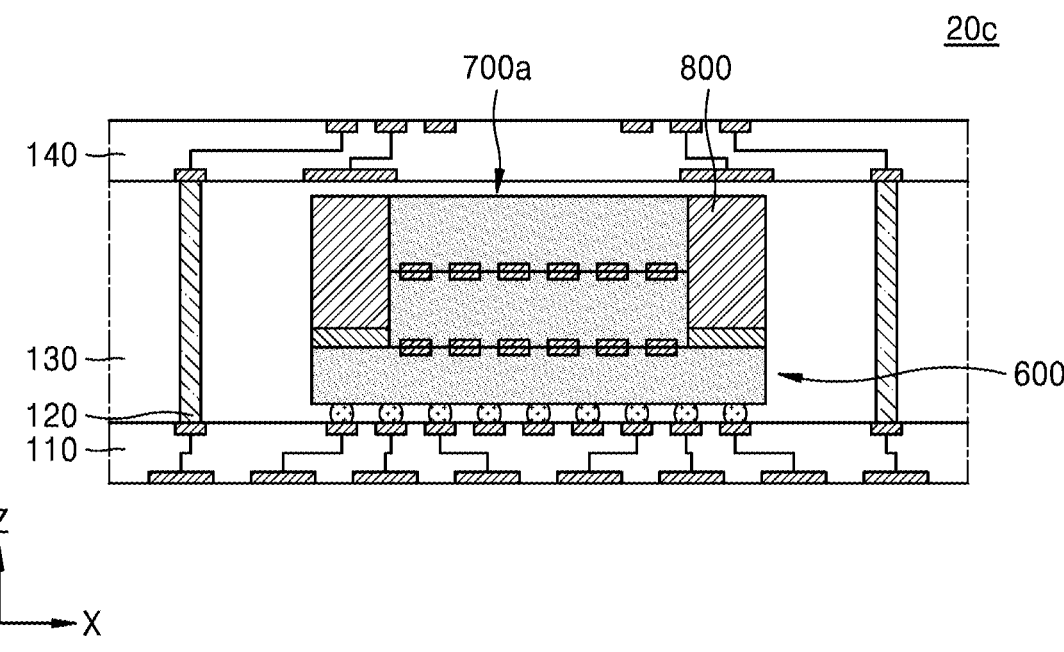
FIG. 13 is a cross-sectional view schematically illustrating a semiconductor package according to another example embodiment of the inventive concepts.

FIG. 13 is a cross-sectional view schematically illustrating a semiconductor package according to another example embodiment of the inventive concepts.

Referring to FIG. 13, the semiconductor package 20c may include a plurality of first dies. The semiconductor package 20c may include a plurality of second dies 700a. The plurality of first dies and the plurality of second dies 700a may have through electrodes. The through electrodes may be TSVs having a structure of penetrating silicon of the dies. The plurality of first dies may be electrically connected to each other through the through electrodes. The plurality of second dies 700a may be electrically connected to each other through the through electrodes.

The plurality of first dies may be stacked on the Z-axis so that the ends thereof coincide with each other. Ends of the plurality of second dies 700a may be stacked on the Z-axis to coincide with each other. The heat dissipation unit 800 may be located on the side surfaces of the plurality of second dies 700a. The thickness of the heat dissipation unit 800 may be equal or substantially equal to the sum of the heights of the plurality of second dies 700a.

A plurality of dies may be stacked for miniaturization of the semiconductor package 20c. However, as the dies are stacked, a portion that emits heat may cause a problem. Heat generated from the plurality of dies may be effectively dissipated to the outside through the semiconductor package 20c including the heat dissipation unit 800.

Figure 14:
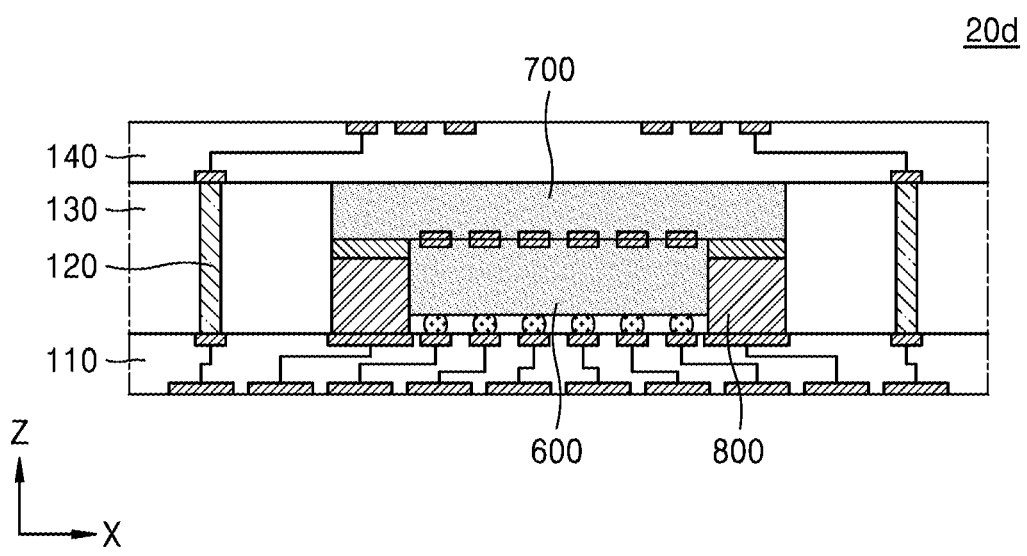
FIG. 14 is a cross-sectional view schematically illustrating a semiconductor package according to another example embodiment of the inventive concepts.

Referring to FIG. 14, an example embodiment of a semiconductor package in which the area of the active surface of the second die 700 is larger than the area of the active surface of the first die 600 will be described in detail.

FIG. 14 is a cross-sectional view schematically illustrating a semiconductor package according to another example embodiment of the inventive concepts.

Referring to FIG. 14, the heat dissipation unit 800 may be located on the side surfaces of the first die 600. The second die 700 may be located above the heat dissipation unit 800. The heat dissipation redistribution structure is the first redistribution structure 110. The heat dissipation unit 800 may be bonded to a lower portion of the second die 700 using a substance having a thermal conductivity of about 10 W/m·K or more and about 100 W/m·K or less. A thermal interface material (TIM) is an example of a material having the thermal conductivity. In addition, the heat dissipation unit 800 may be bonded to the first die 600 on the lower portion of the second die 700 through a solder, a silver paste, and the like.

Heat generated from the first die 600 and the second die 700 may be transferred to the heat dissipation unit 800 having a high thermal conductivity, and the heat transferred to the heat dissipation unit 800 may be transferred to the first redistribution structure 110 through the EMC. Heat transferred to the first redistribution structure 110 may be transferred to the first outer pad along the first redistribution and discharged to the outside. Through this heat transfer process, heat generated from the first die 600 and the second die 700 may be effectively discharged to the outside.

FIGS. 15A to 15I are cross-sectional views illustrating a method of manufacturing a semiconductor package according to a process order according to an example embodiment.

Figure 15A:
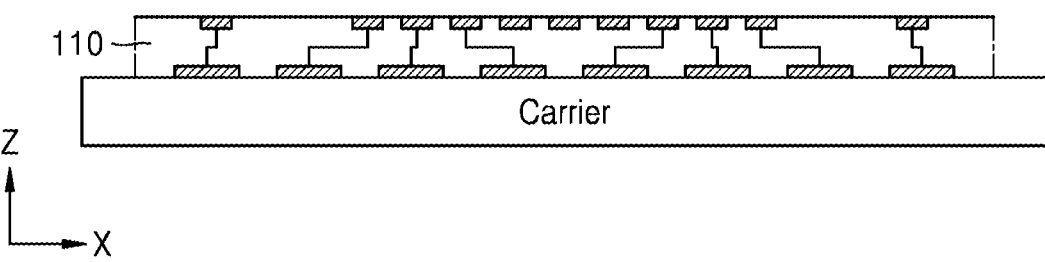
FIGS. 15A, 15B, 15C, 15D, 15E, 15F, 15G, 15H, and 15I are cross-sectional views illustrating a method of manufacturing a semiconductor package according to a process order according to an example embodiment.

FIG. 15A illustrates that a first redistribution structure 110 is positioned on a carrier. To locate another configuration on the first redistribution structure 110, the first redistribution structure 110 may be positioned on a relatively thicker carrier than the first redistribution structure 110.

Figure 15B:
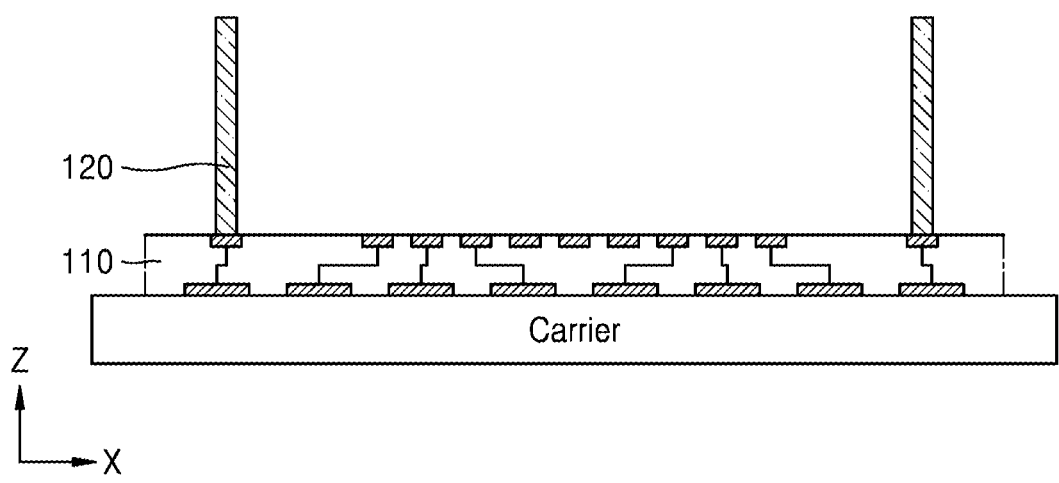

FIG. 15B illustrates that the first posts 120 are positioned on the first redistribution structure 110. The first posts 120 may be located in a redistribution line pattern on an upper portion of the first redistribution structure 110. The first posts 120 may improve structural stability of the semiconductor package. The first posts 120 may electrically connect the first redistribution structure 110 with the second redistribution structure (e.g., 140 of FIG. 15I). The substance constituting the first posts 120 may include copper, an alloy thereof, or the like.

Figure 15C:
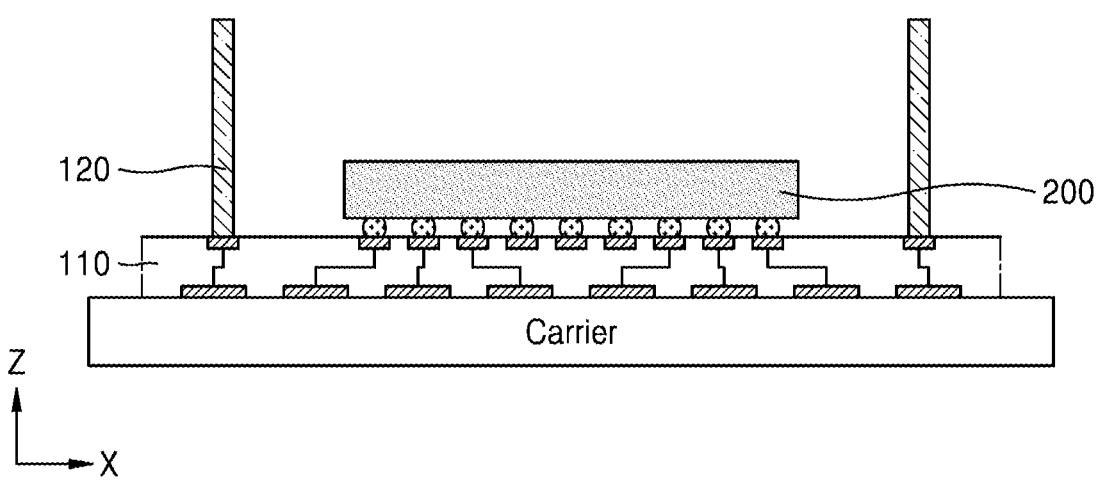

FIG. 15C illustrates that the first die 200 is positioned on the first redistribution structure 110. An area of the active surface of the first die 200 may be a first area. The first die 200 may be electrically connected to the first redistribution structure 110. Wire bonding, flip bonding, or the like may be used as a connection scheme between the first die 200 and the first redistribution structure 110.

Figure 15D:
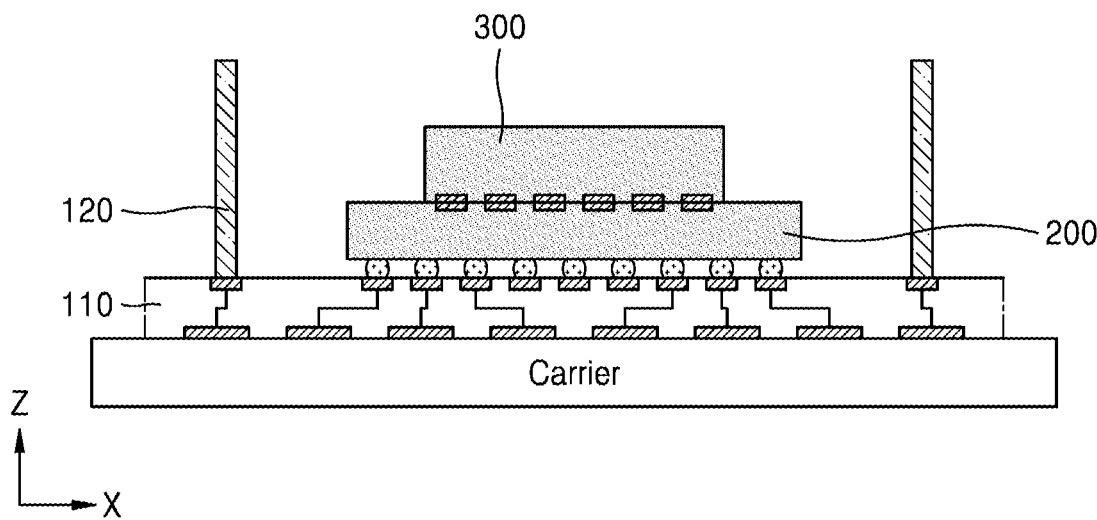

FIG. 15D illustrates that the second die 300 is positioned on the first die 200. An area of the active surface of the second die 300 may be a second area. The second area may be different from the first area. That is, the length of the second die 300 in the X-axis direction (or the Y-axis direction) may be different from the length of the first die 200 in the X-axis direction (or the Y-axis direction). Although FIG. 15D illustrates a case in which the second area is smaller than the first area, the example embodiments are not limited thereto, and the second area may be larger than the first area. The second die 300 may be electrically connected to the first die 200. A wire bonding method, a TSV method, a hybrid bonding method, or the like may be used as a connection scheme between the second die 300 and the first die 200. The second die 300 may be positioned on the first die 200 such that the center of the active surface of the second die 300 and the center of the active surface of the first die 200 are on a straight line in the Z-axis direction. In addition, the second die 300 may be positioned on the first die 200 such that the side surfaces of the second die 300 and the side surfaces of the first die 200 coincide with each other.

Figure 15E:
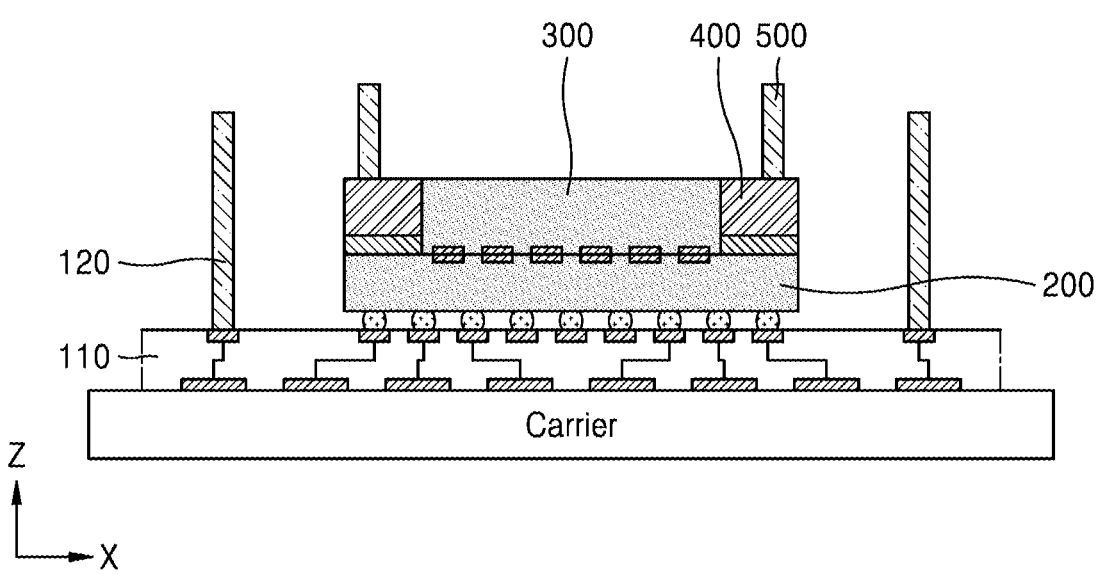

FIG. 15E illustrates that the heat dissipation unit 400 and one of the second posts 500 are positioned on side surfaces of the second die 300. The heat dissipation unit 400 may be located on an upper portion of the first die 200 where the first die 200 and the second die 300 do not overlap. The heat dissipation unit 400 may surround at least one side surface of the second die 300.

The heat dissipation unit 400 may be bonded to an upper portion of the first die 200 using a substance having a thermal conductivity in a range of about 10 W/m·K or more to about 100 W/m·K or less. A material bonding the heat dissipation unit 400 and the first die 200 and a material bonding the second die 300 and the first die 200 may be different from each other. The heat dissipation unit 400 and the first die 200 may not be electrically connected to each other. The first die 200 and the second die 300 may be electrically connected to each other.

As a constituent material of the heat dissipation unit 400, silicon having higher thermal conductivity than that of the molding unit 130 may be included. For example, bulk silicon or the like may be included as a constituent material of the heat dissipation unit 400. The molding unit 130 may have low thermal conductivity to determine a constituent material for structural stability. Heat generated in the semiconductor package 10 may be discharged through the molding unit 130, but heat dissipation is difficult due to low thermal conductivity. The semiconductor package 10 may be heat-dissipated through the heat dissipation unit 400 on the side surfaces of the die as well as through the molding unit 130 on the upper or lower part of the die.

The second posts 500 will be described in detail as an example of the semiconductor package in which the area of the active surface of the second die 300 is smaller than the area of the active surface of the first die 200. The second posts may be in contact with the upper surface of the heat dissipation unit. The area of the bottom surface of each of the second posts 500 may be different from the area of the upper surface of the heat dissipation unit 400. The area of the bottom surface of each of the second posts 500 may be smaller than the area of the upper surface of the heat dissipation unit 400. After the second posts 500 are formed on the upper surface of the heat dissipation unit 400 in a separate process, the heat dissipation unit 400 on which the second posts 500 have been formed may be positioned on the side surfaces of the second die 300. In addition, after the heat dissipation unit 400 is positioned on the side surfaces of the second die 300 and the molding unit (e.g., 130 of FIG. 15I) is filled, the second posts 500 may be formed on the heat dissipation unit 400 through a via process.

Figure 15F:
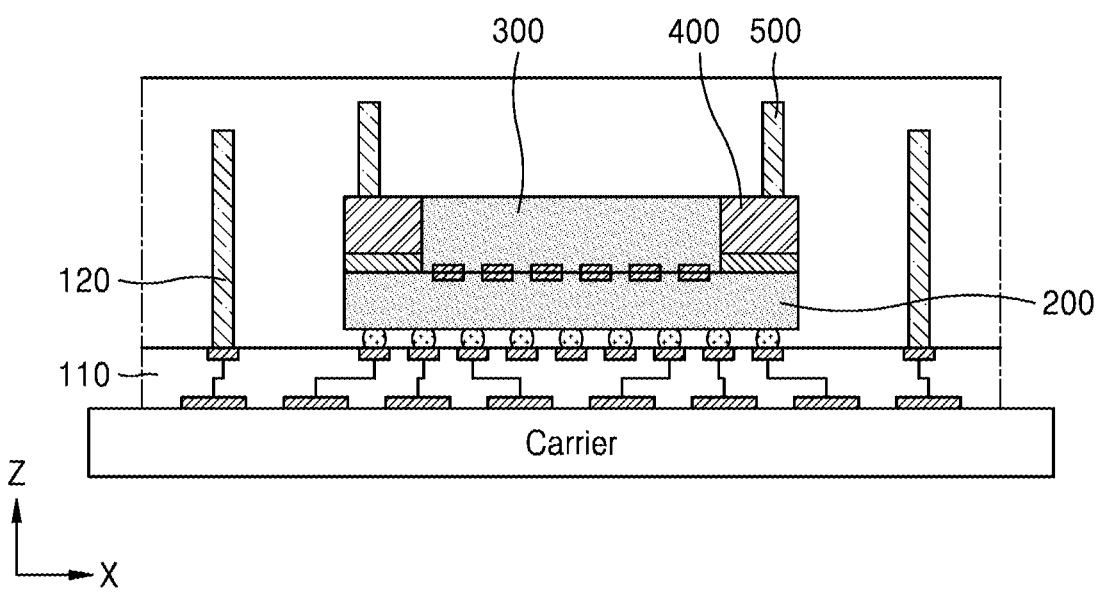
Figure 15G:
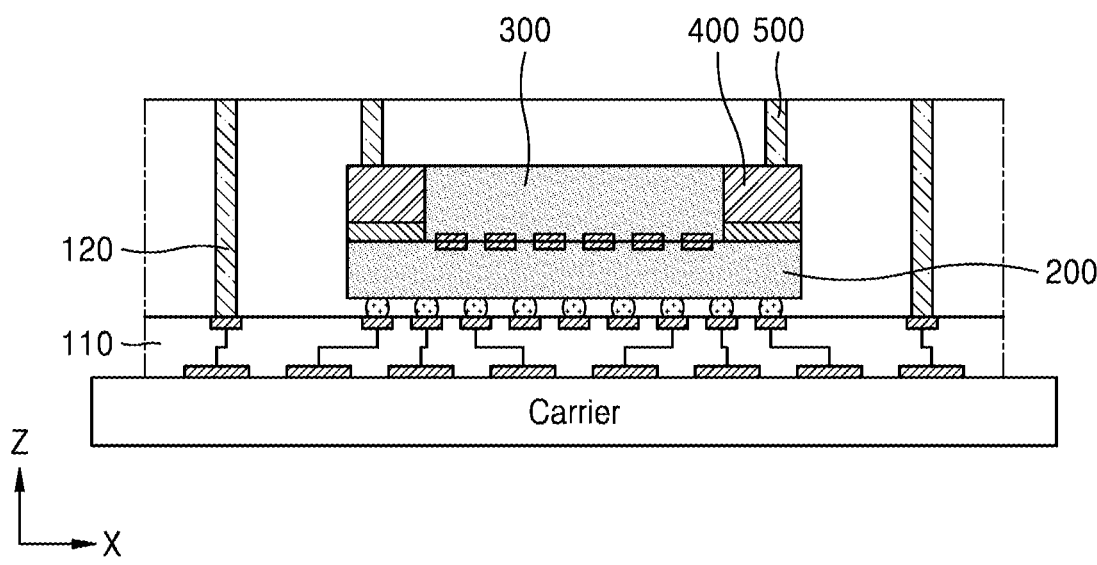

FIG. 15F illustrates that the molding unit 130 is filled on the first redistribution structure 110. FIG. 15G illustrates that the molding unit 130 is grounded until the first posts 120 and the second posts 500 are exposed. The molding unit 130 may fill an empty space between components positioned above the first redistribution structure 110. The molding unit 130 may not only increase structural stability but also prevent a short circuit of the die.

Figure 15H:
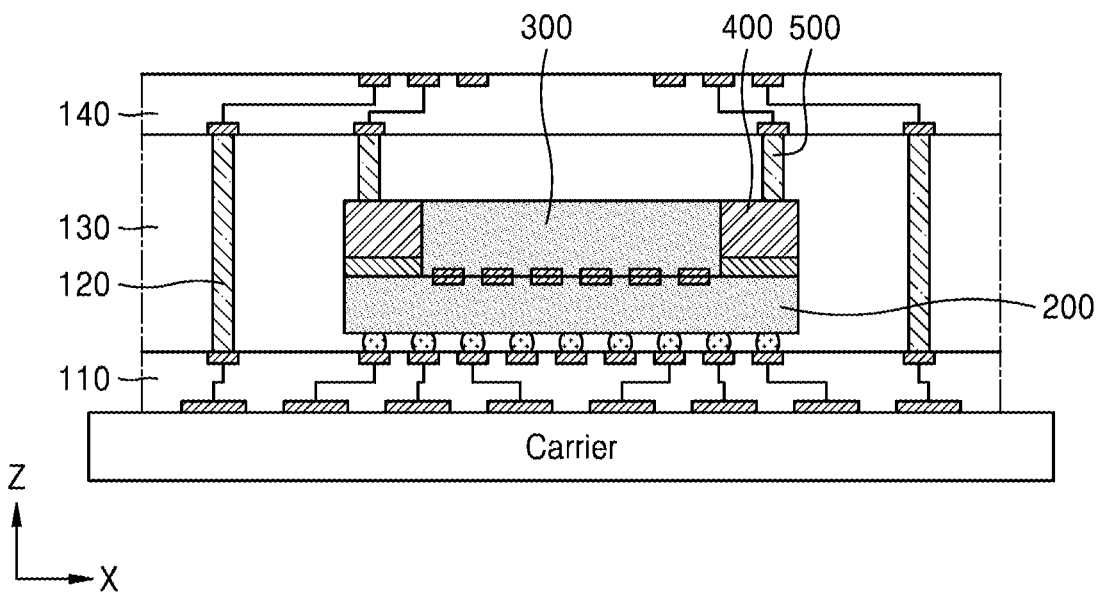

FIG. 15H illustrates that the second redistribution structure 140 is positioned on the first posts 120. The second redistribution structure 140 may be electrically connected to the first redistribution structure 110 by contacting the first post 120 and the inner pad of the second redistribution structure 140.

In the case of a semiconductor package in which the area of the active surface of the second die 300 is smaller than the area of the active surface of the first die 200, the second redistribution structure 140 may be located above the second post 500. Specifically, the inner pad of the second redistribution structure 140 may be connected to the second posts 500. The second posts 500 may thermally connect the second redistribution structure 140 with the heat dissipation unit 400. In some example embodiments, the substance constituting the second posts 500 may include copper, an alloy thereof, or the like.

Figure 15I:
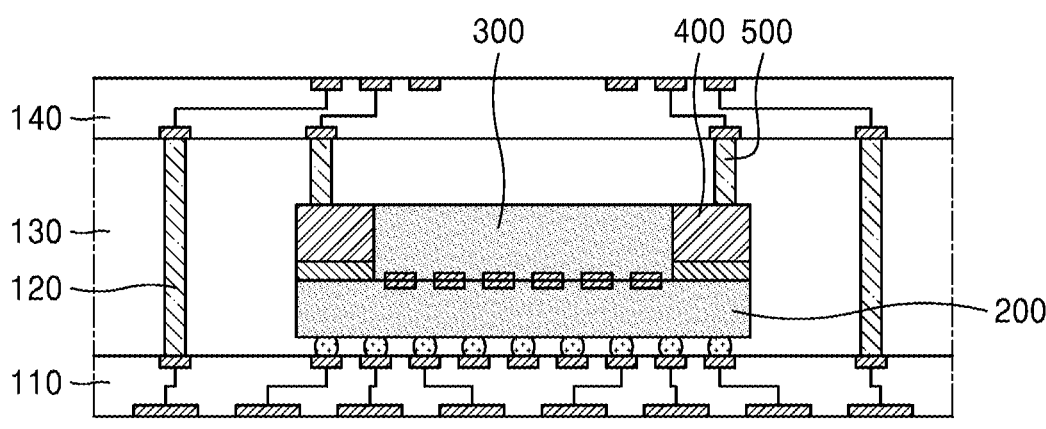
Figure 15I:
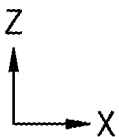

FIG. 15I illustrates that the first redistribution structure 110 is separated from the carrier. Thereafter, a solder or the like may be positioned on the lower surface of the first redistribution structure 110.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the inventive concepts have been particularly shown and described with reference to some example embodiments thereof, it will be understood that various changes in form and details may be made therein without departing from the scope of the inventive concepts.

What is claimed is:

1. A semiconductor package comprising:
   a first redistribution structure including a first inner pad, a first outer pad, and a first redistribution line, the first redistribution line connecting the first inner pad to the first outer pad;
   a first die above the first redistribution structure, the first die including an active surface having a first area;
   a second die above the first die, the second die including an active surface having a second area, the second area different from the first area;
   a heat dissipation unit on side surfaces of whichever one of the first die and the second die has an active surface with a smaller area;
   a second redistribution structure above the second die, the second redistribution structure including a second inner pad, a second outer pad, and a second redistribution line, the second redistribution line connecting the second inner pad and the second outer pad;
   a first post protruding from an upper surface of the first redistribution structure and extending to a lower surface of the second redistribution structure;
   a second post connecting the heat dissipation unit with a heat dissipation redistribution structure as a thermal path; and a molding unit filling an empty space between the first redistribution structure and the second redistribution structure, wherein the heat dissipation redistribution structure comprises whichever one of the first redistribution structure and the second redistribution structure is closer to the heat dissipation unit, an outer pad of the heat dissipation redistribution structure is exposed to an outside of the semiconductor package, an inner pad of the heat dissipation redistribution structure is in contact with the second post, and the heat dissipation unit includes silicon having a thermal conductivity higher than a thermal conductivity of the molding unit.

2. The semiconductor package of claim 1, wherein the first post is configured to electrically connect the first redistribution structure and the second redistribution structure to each other, and the second post is configured to thermally connect the heat dissipation unit and the heat dissipation redistribution structure to each other.

3. The semiconductor package of claim 1, wherein the first redistribution structure comprises a plurality of first inner pads and a plurality of first outer pads, the second redistribution structure comprises a plurality of second inner pads and a plurality of second outer pads, the first post is in contact with the first inner pads and the second inner pads, and the first redistribution structure and the second redistribution structure are electrically connected to each other, and the second post is configured to be in contact with the heat dissipation unit and the inner pad of the heat dissipation redistribution structure which does not contact the first post, and the heat dissipation unit and the heat dissipation redistribution structure are thermally connected to each other.

4. The semiconductor package of claim 1, wherein a width of a first end of the second post adjacent to the heat dissipation redistribution structure is greater than a width of a second end of the second post opposite the first end.

5. The semiconductor package of claim 1, further comprising a plurality of second posts connecting the heat dissipation unit with the heat dissipation redistribution structure.

6. The semiconductor package of claim 1, wherein the first area is greater than the second area.

7. The semiconductor package of claim 1, wherein the first post comprises copper, and the second post comprises copper.

8. The semiconductor package of claim 1, wherein the heat dissipation unit comprises at least one copper pillar.

9. A semiconductor package comprising:

a first redistribution structure including a first inner pad, a first outer pad, and a first redistribution line, the first redistribution line connecting the first inner pad to the first outer pad;

a first die above the first redistribution structure, the first die including an active surface having a first area;

a second die above the first die, the second die including an active surface having a second area, the second area different from the first area;

a heat dissipation unit located on side surfaces of whichever one of the first die and the second die has an active surface with a smaller area;

a second redistribution structure above the second die, the second redistribution structure including a second inner pad, a second outer pad, and a second redistribution line, the second redistribution line connecting the second inner pad to the second outer pad;

a first post protruding from an upper surface of the first redistribution structure and extending to a lower surface of the second redistribution structure; and a molding unit filling an empty space between the first redistribution structure and the second redistribution structure, a heat dissipation redistribution structure comprises whichever one of the first redistribution structure and the second redistribution structure is closer to the heat dissipation unit, an outer pad of the heat dissipation redistribution structure exposed to an outside of the semiconductor package, and the heat dissipation unit comprising silicon having a higher thermal conductivity than a thermal conductivity of the molding unit, to transfer heat to the heat dissipation redistribution structure.

10. The semiconductor package of claim 9, wherein the heat dissipation unit is configured to thermally connect to the first die, and the heat dissipation unit is configured to thermally connect to the second die.

11. The semiconductor package of claim 9, wherein the heat dissipation unit is configured not to be electrically connected to the heat dissipation redistribution structure.

12. The semiconductor package of claim 9, wherein the heat dissipation unit contacts an inner pad of the heat dissipation redistribution structure.

13. The semiconductor package of claim 9, wherein the heat dissipation unit comprises at least one copper pillar.

14. The semiconductor package of claim 9, wherein the first area is greater than the second area.

15. The semiconductor package of claim 14, wherein the heat dissipation unit is located on side surfaces of the second die, and the heat dissipation unit surrounds at least one side surface of the second die.

16. The semiconductor package of claim 14, wherein a heat expansion rate of the heat dissipation unit is same as a thermal expansion rate of the first die.

17. The semiconductor package of claim 9, wherein the second area is greater than the first area.

18. The semiconductor package of claim 17, wherein the heat dissipation unit is bonded to a lower portion of the second die by a material having a thermal conductivity in a range of 10 W/m·K to 100 W/m·K.

19. The semiconductor package of claim 9, further comprising:

a plurality of first dies above the first redistribution structure; and a plurality of second dies above the first dies.

20. A semiconductor package comprising:

a first redistribution structure including a first inner pad, a first outer pad, and a first redistribution line, the first redistribution line connecting the first inner pad to the first outer pad;

a first die above the first redistribution structure, the first die including an active surface having a first area;

a second die above the first die, the second die including an active surface having a second area, the second area smaller than the first area;

a heat dissipation unit on side surfaces of the second die, the heat dissipation unit including at least one copper pillar;

a second redistribution structure above the second die, the second redistribution structure including a second inner pad, a second outer pad, and a second redistribution line, the second redistribution line connecting the second inner pad to the second outer pad;

a first post protruding from an upper surface of the first redistribution structure and extending to a lower surface of the second redistribution structure;

a plurality of second posts connecting the heat dissipation unit to the second redistribution structure as a thermal path; and a molding unit filling an empty space between the first redistribution structure and the second redistribution structure, wherein the heat dissipation unit includes silicon having a higher thermal conductivity than a thermal conductivity of the molding unit, the second outer pad of the second redistribution structure is exposed to an outside of the semiconductor package, the second inner pad of the second redistribution structure is in contact with the second post, the first post is configured to contact the first inner pad and the second inner pad to electrically connect the first redistribution structure and the second redistribution structure to each other, and the second post is configured to contact the heat dissipation unit and another second inner pad of the second redistribution structure which is not in contact with the first post, and the heat dissipation unit and the second redistribution structure are thermally connected to each other.

\* \* \* \* \*